United States Patent [19]
Winer et al.

[11] Patent Number: 6,159,753
[45] Date of Patent: *Dec. 12, 2000

[54] METHOD AND APPARATUS FOR EDITING AN INTEGRATED CIRCUIT

[75] Inventors: Paul Winer, Santa Clara; Richard H. Livengood, Los Gatos, both of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/771,273

[22] Filed: Dec. 20, 1996

[51] Int. Cl.$^7$ .......................... H01L 21/00; H01L 21/44; H01L 21/302

[52] U.S. Cl. ............................. 438/4; 438/598; 438/599; 438/662; 438/708

[58] Field of Search .................................. 438/14, 16, 17, 438/18, 599, 4, 106, 661, 662, 598, 508

[56] References Cited

U.S. PATENT DOCUMENTS

| | | | |
|---|---|---|---|
| 4,545,111 | 10/1985 | Johnson et al. | 29/574 |
| 4,868,068 | 9/1989 | Yamaguchi et al. | 428/596 |
| 4,995,002 | 2/1991 | Yamada et al. | 365/189.01 |
| 5,043,297 | 8/1991 | Suzuki et al. | 438/598 |
| 5,196,362 | 3/1993 | Suzuki | 437/48 |
| 5,208,178 | 5/1993 | Usami | 438/6 |
| 5,233,310 | 8/1993 | Inoue | 330/277 |
| 5,429,994 | 7/1995 | Ishikawa | 438/676 |
| 5,497,034 | 3/1996 | Yamaguchi et al. | 257/741 |
| 5,832,595 | 11/1998 | Maruyama et al. | 29/829 |

FOREIGN PATENT DOCUMENTS

| | | | |
|---|---|---|---|
| 88305199 | 8/1988 | European Pat. Off. | H01L 21/66 |

OTHER PUBLICATIONS

Paul Winer, "IC Failure Analysis, E–Beam Tutorial," International Reliability and Physics Symposium, 1996.

Scott Silverman, "Laser Microchemical Technology Enables Real–Time Editing of First–Run Silicon," Solid State Technology, 1996.

*Primary Examiner*—John F. Niebling
*Assistant Examiner*—Ha Tran Nguyen
*Attorney, Agent, or Firm*—Blakely, Sokoloff, Taylor & Zafman, LLP

[57] ABSTRACT

A method and an apparatus for editing an integrated circuit. In one embodiment, an integrated circuit substrate is placed into a laser chemical vapor deposition (LCVD) tool and a conductive metal film is deposited onto the integrated circuit substrate over an area of interest. The integrated circuit substrate is subsequently placed into a focused ion beam (FIB) tool where an optional FIB cleaning step is performed on the conductive element deposited by the LCVD tool to help ensure that a good electrical contact can be made. The FIB tool is also used to introduce any desired cuts into signal lines of the integrated circuit to complete edits. The FIB is also used to remove passivation over integrated circuit nodes of interest to expose buried metal lines for subsequent coupling to the conductive element deposited with the LCVD tool. The FIB tool is then used to deposit a focused ion beam chemical vapor deposition (FIBCVD) conductive element between the exposed integrated circuit nodes of interest and the conductive element deposited with the LCVD tool. As a result, a new conductive element between the nodes of interest is formed through the conductive elements formed by both the LCVD and FIB tools.

16 Claims, 5 Drawing Sheets

METHOD AND APPARATUS FOR EDITING AN INTEGRATED CIRCUIT

BACKGROUND OF THE INVENTION

1. Field of the Invention

The present invention relates generally to the field of integrated circuit testing and, more specifically, the present invention relates to a method of making modifications to an integrated circuit.

2. Description of the Related Art

Once a newly designed integrated circuit has been formed on a silicon substrate, the integrated circuit must be thoroughly tested to ensure that the circuit performs as designed. Portions of the integrated circuit that do not function properly must be identified so that they can be fixed by modifying the design the of the integrated circuit. This process of testing an integrated circuit to identify problems with its design is known as debugging. After debugging the integrated circuit and correcting any problems with its design, the final fully functional integrated circuit designs are used to mass produce the integrated circuits in a manufacturing environment for consumer use.

During the debugging process, it is sometimes necessary to add, delete or reroute signal line connections within the integrated circuit. For instance, assume that FIG. 1 shows an integrated circuit 101 that requires edits to be made. In this example, circuit block A 103 is coupled to circuit block B 107 through inverter 105. If it is determined during the debug process that the signal from circuit block A 103 should not be inverted when received by circuit block B 107, integrated circuit 101 may be edited such that inverter 105 is effectively removed from integrated circuit 101 and that circuit block A 103 is directly connected to circuit block B 107.

Using prior art techniques, integrated circuit 101 may be edited as follows. Inverter 105 may be disconnected from circuit block A 103 and circuit block B 107 by physically cutting the signal line as shown in FIG. 1 with cuts 109 and 111. After cuts 109 and 111 are made, circuit block A 103 and circuit block B 107 are no longer connected. In order to reconnect circuit block A 103 and circuit block B 107, passivation is removed from integrated circuit 101 at locations 113 and 115 to expose the buried metal of the signal line connected to circuit block A 103 and circuit block B 107. After the passivation is removed from the signal line at locations 113 and 115, a new metal line 117 is deposited on the integrated circuit substrate over the exposed pieces of metal at locations 113 and 115 to directly connect circuit block A 103 to circuit block B 107.

In general, a focused ion beam (FIB) tool is used to deposit focused ion beam chemical vapor deposition (FIBCVD) lines to edit integrated circuits. The FIB tool is a precision device that can be used to form cuts 109 and 111 and remove passivation from areas such as locations 113 and 115 to form openings in the dielectric areas over the metal lines of an integrated circuit. Since FIB tools are precision devices, FIBCVD lines such as signal line 117 of FIG. 1 may be deposited with high precision to accomplish very complex integrated circuit edits.

A disadvantage with depositing FIBCVD lines with the FIB tool is that the depositing process is very time consuming and results in signal lines having a considerable amount of resistance. Consequently, when very long signal lines need to be deposited during the editing process of an integrated circuit, the resulting signal lines may take a very long time to deposit and may also suffer from an undesirably high amount of resistance.

Another prior art technique used to deposit metal lines is the use of a laser chemical vapor deposition (LCVD) tool. In general, LCVD tools lack the ability to have the same degree of precision as FIB tools. LCVD tools, however, do have the ability to deposit metal lines relatively quickly. In addition, metal lines deposited with LCVD tools are generally low resistance lines in comparison with the metal FIBCVD lines deposited with FIB tools.

FIG. 2 shows an example of one use for an LCVD type tool. In this example, a multi-chip module 201 includes an integrated circuit die 203 and another integrated circuit die 205. In this example, assume multi-chip module 201 must be edited such that bond pad 207 of integrated circuit die 203 must be coupled to bond pad 209 of integrated circuit die 205. An LCVD tool may be used to deposit a metal line 211 between bond pads 207 and 209. Assuming that the distance between bond pads 207 and 209 is relatively long and that the deposition of a signal line between bond pads 207 and 209 does not require an extremely high degree of precision, an LCVD tool is ideally suited to deposit signal line 211. Thus, bond pads 207 and 209 may be coupled to one another in a relatively short period of time with a relatively low resistance signal line 211 by using an LCVD tool.

It is appreciated that there are some instances in which an LCVD tool may be used to perform relatively simple integrated circuit edits. However, it is noted that for edits of integrated circuits that require a great deal of precision, LCVD tools are generally not well suited to perform these complex integrated circuit edits. Moreover, there are LCVD tools that cannot be used practically for removing the passivation over metal lines such as those shown at locations 113 and 115 in FIG. 1. Consequently, in those instances where it is necessary to perform complex edits with long signal lines, FIB tools are generally used to deposit FIBCVD lines in the prior art. Thus, long edited signal lines require a long period time to deposit and also suffer from high resistance.

Therefore, what is desired is a method and an apparatus for editing integrated circuits that has the ability to perform complex edits as well as the ability to deposit long signal lines that have relatively low resistance in a relatively short period of time.

SUMMARY OF THE INVENTION

A method and an apparatus for editing an integrated circuit is described. In one embodiment, a laser chemical vapor deposition tool is used to deposit a first conductive element on an integrated circuit. A second conductive element is deposited with a focused ion beam tool between a first node of the integrated circuit and the first conductive element such that the first node of the integrated circuit is coupled to the first conductive element through the second conductive element. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for editing an integrated circuit is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

The present invention provides an ohmic connection between metallic interconnections of an integrated circuit. The connections are provided by both a focused ion beam (FIB) and laser chemical vapor deposition (LCVD) tools. As discussed, present day techniques use either FIB line deposition or LCVD line deposition independently. Each technique has its own advantages and disadvantages. The present invention employs each tool to its best advantage by making a connection between two nodes of the integrated circuit using both tools when performing edits.

Figure 1:
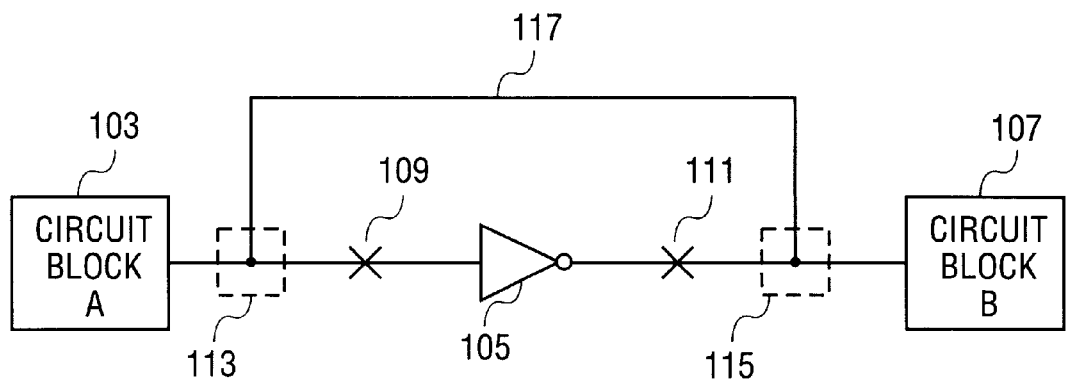
FIG. 1 is an illustration of an edit performed on an integrated circuit using a focused ion beam tool.
Figure 2:
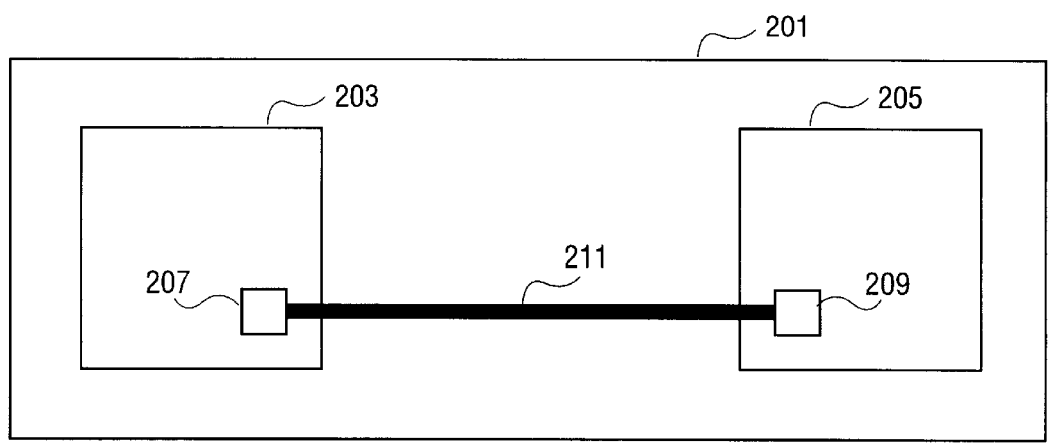
FIG. 2 is an illustration of bond pads between been two integrated circuit dies on a multi-chip module being coupled to one another using a laser chemical vapor deposition tool.
Figure 3:
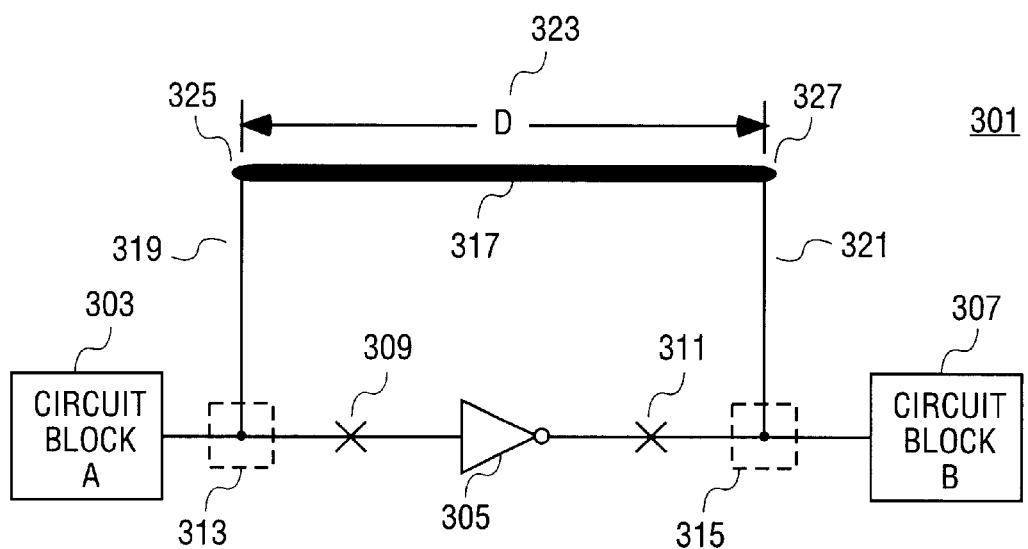
FIG. 3 is an illustration of an edit performed on an integrated circuit in accordance with the teachings of the present invention.

FIG. 3 is an illustration of an integrated circuit 301 which includes a circuit block A 303 coupled to circuit block B 307 through inverter 305. Assume an edit must be performed on integrated circuit 301 that removes inverter 305 from the coupling between circuit block A 303 and circuit block B 307. If the distance D 323 between nodes 313 and 315 is relatively long, such as for example greater than or equal to 200 microns in length, then a focused ion beam chemical vapor deposition (FIBCVD) metal line deposited with a FIB tool would require a relatively long amount of time to deposit and would also suffer from a relatively high amount of resistance. The present invention remedies these disadvantages by employing an LCVD tool to deposit a conductive element 317 as shown in FIG. 3.

In one embodiment of the present invention, conductive element 317 is made of platinum. It is appreciated that conductive element 317 may be made of other conductive materials such as for example gold or tungsten. By depositing conductive element 317 with an LCVD tool, conductive element 317 can be deposited in a relatively short amount of time and will also have relatively low resistance.

A FIB tool can then be used in accordance with the teachings of the present invention to perform the precision work necessary to couple conductive element 317 to nodes 313 and 315 of integrated circuit 301 to complete the editing process. Assuming inverter 305 is to be removed in the editing process, the FIB tool may then be used to introduce cuts 309 and 311 into the signal line coupling circuit block A 303 and circuit block B 307 as shown. Then, inverter 305 will be effectively removed from integrated circuit 301. It is appreciated that in other instances, it may not be necessary to cut any pre-existing couplings between in the integrated circuit to complete the editing process in accordance with the teachings of the present invention.

The FIB tool may also be used to perform the step of selectively removing the passivation over the buried metal lines to create an opening in the dielectric areas over the metal lines at nodes 313 and 315 of integrated circuit 301. Once the metal lines at nodes 313 and 315 are exposed, the FIB tool may then be used to deposit a FIBCVD conductive element 319 between node 313 and conductive element 317. The FIB tool is also used to deposit FIBCVD conductive element 321 between node 315 and conductive element 317 as shown in FIG. 3. In one embodiment of the present invention, conductive elements 319 and 321 are made of tungsten. It is appreciated that other conductive materials may be used, such as but not limited to platinum and gold. It is noted that since conductive elements 319 and 321 are relatively short in length, the amount of time required to deposit the FIBCVD lines is minimal. In addition, the amount of resistance inherent in conductive elements 319 and 321 are also minimized since conductive elements 319 and 321 are relatively short in length.

It is also appreciated that conductive elements 317, 319 and 321 may be formed with multiple depositions. That is, each one of the conductive elements 317, 319 and 321 may be formed by making more than one deposit per conductive element. For example, there may be an occasion where it is desired that conductive element 317 be formed in the shape of an "L" or a "Z" (not shown). In this instance, each leg of conductive element 317 may be formed with a separate depositing step.

In one embodiment of the present invention, a FIB cleaning step is performed before conductive elements 319 and 321 are deposited to help ensure a good electrical contact between conductive element 317 and conductive elements 319 and 321 respectively. The FIB cleaning step is performed at the locations in conductive element 317 that come in electrical contact with conductive elements 319 and 321. These locations are labeled 325 and 327 in FIG. 3. It is appreciated that the FIB cleaning step is optional and that there may be instances where an adequate electrical connection may be formed between conductive element 317 and conductive elements 319 and 321 respectively without having to clean conductive element 317 at locations 325 and 327.

Figure 4:
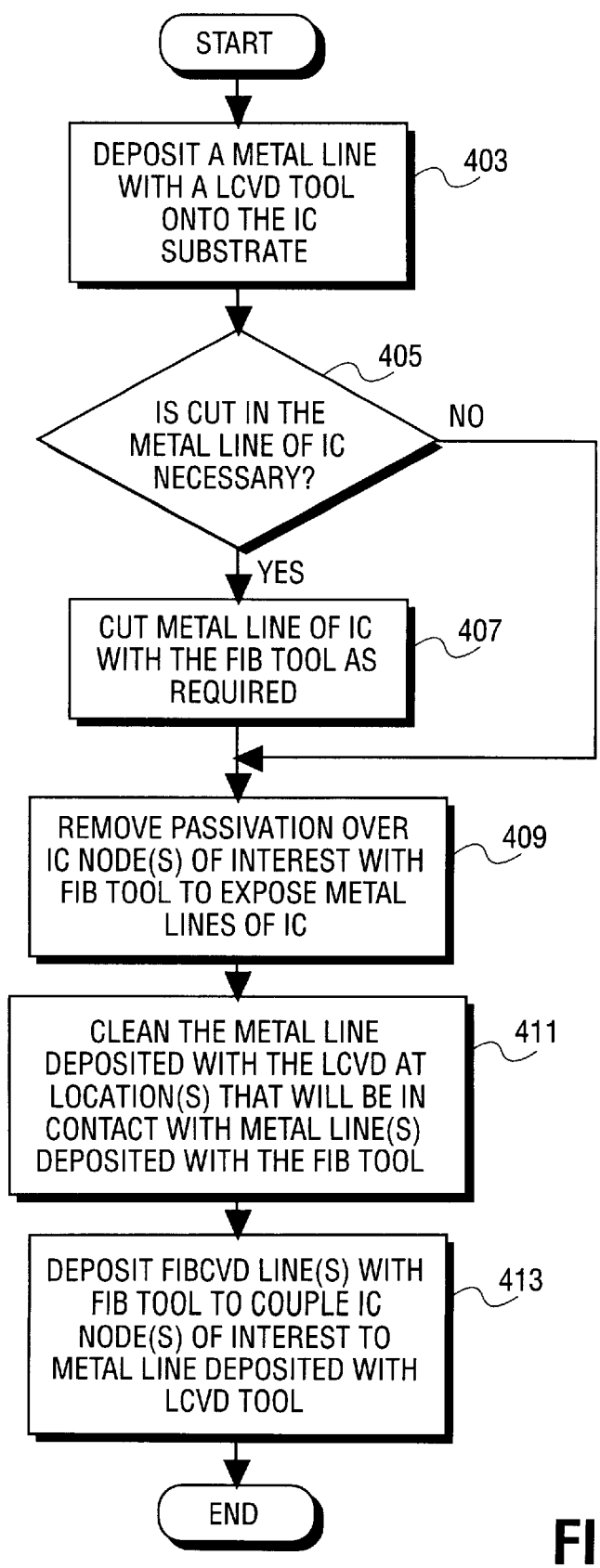
FIG. 4 is a flow diagram of steps performed in accordance with the teachings of the present invention.

FIG. 4 is a flow diagram 401 of steps performed in accordance with the teachings of the present invention. As indicated in block 403, a metal line is deposited with an LCVD on the integrated circuit. This metal line is deposited in a relatively short period of time and has relatively low resistance. In one embodiment of the present invention, this step is performed by first placing the integrated circuit substrate into an LCVD tool and a metal film, or conductive element, is deposited onto the integrated circuit substrate over the area of interest.

Next, as indicated in decision block 405, it is determined whether any cuts in the metal lines of the integrated circuit are necessary. That is, if certain nodes in the integrated circuit being edited need to be disconnected from one another, the corresponding metal lines of the integrated circuit may be cut with the high precision FIB tool as required, as indicated in processing block 407. Afterwards, the passivation over the integrated circuit nodes of interest is removed to uncover the metal lines of the integrated circuit as required. Accordingly, the FIB tool may be used to expose buried metal lines to provide electrical access to the nodes of interest.

Processing block 411 indicates the optional step of cleaning the metal line deposited with the LCVD tool at locations that will be in electrical contact with FIBCVD metal lines that will be deposited with the FIB tool. By performing the step indicated in processing block 411, there is an increased likelihood that a good electrical connection will be formed between the conductive element formed with the LCVD tool and the FIBCVD conductive elements that will be deposited by the FIB tool.

Finally, processing block 413 shows the step of depositing FIBCVD metal lines with the FIB tool to couple the integrated circuit nodes of interest to the metal line deposited with the LCVD to form the electrical path between the nodes of interest through the metal lines deposited with the FIB and LCVD tools.

Figure 5:
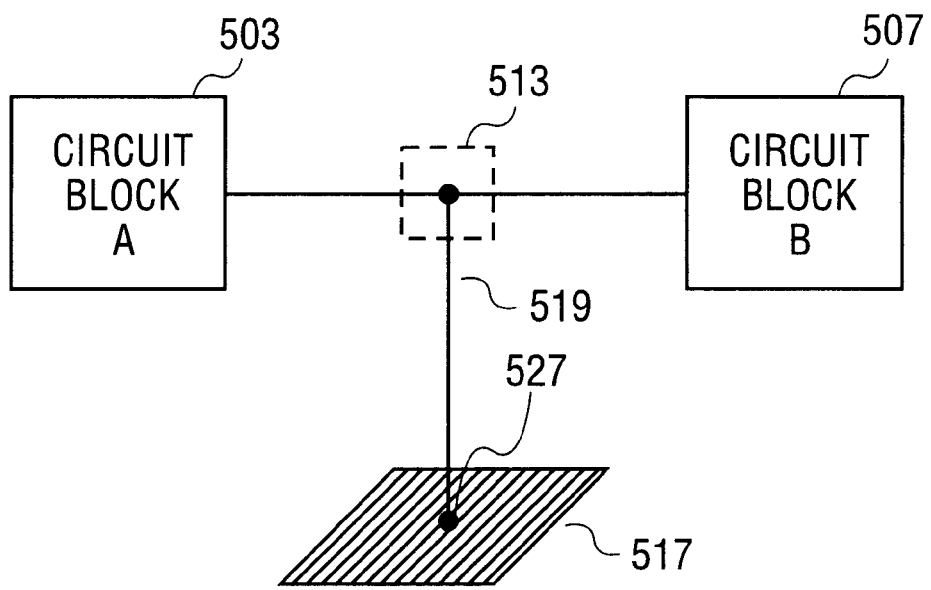
FIG. 5 is an illustration of another embodiment of an edit performed on an integrated circuit in accordance with the teachings of the present invention.

In FIG. 5, another embodiment of the present invention is illustrated with integrated circuit 501, which includes circuit block A 503 coupled to circuit block B 507. Assume integrated circuit 501 is desired to be edited and that additional capacitance must be added to the signal line coupling circuit block A 503 to circuit block B 507. An LCVD tool is utilized to deposit conductive element 517 on the integrated circuit substrate. In one embodiment, conductive element 517 is deposited near a ground line of integrated circuit 501 such that the desired capacitance is formed between conductive element 517 and the ground line. Conductive element 517 is then coupled to the signal line at node 513 by depositing conductive element 519 with a FIB tool between node 513 and location 527 of conductive element 517. In one embodiment, the FIB tool is used to selectively remove the passivation over node 513 to expose the buried metal line and create an opening in the dielectric area over node 513. In another embodiment, a FIB cleaning step is performed at location 527 of conductive element 517 to help ensure a good electrical contact between conductive elements 517 and 519. When completed, the desired capacitance is added to the signal line coupling circuit block A 503 to circuit block B 507 as shown in FIG. 5.

It is appreciated that the processing steps discussed with respect to FIGS. 3–5 above are not necessarily limited to being performed in the order in which they are described herein. That is, certain processing steps may be performed in a different order and are still within the teachings of the present invention. For example, referring back to FIG. 3, conductive elements 319 and 321 may be deposited before conductive element 317 is deposited. Thus, the FIB tool may alternatively be used before the LCVD tool on integrated circuit 301 and be in accordance with the teachings of the present invention.

Therefore, an improved method of editing an integrated circuit is described. The present invention combines the precision microsurgery capability, also commonly referred to as die level blue wiring, of a FIB tool with the low resistance, rapid deposition rate of conductive elements with an LCVD tool. Thus, the present invention provides the ability to perform precision complex edits in an integrated circuit in combination with long and low resistance high deposition rate signal lines between distant locations on an integrated circuit using both FIB and LCVD tools.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method for editing an integrated circuit, the method comprising:

depositing a first conductive element on the integrated circuit with a laser chemical vapor deposition (LCVD) tool; and depositing a second conductive element between a first node of the integrated circuit and the first conductive element with a focused ion beam (FIB) tool such that the first node is coupled to the first conductive element through the second conductive element.

2. The method described in claim 1 further comprising depositing a third conductive element between a second node of the integrated circuit and the first conductive element with the FIB tool such that the first node is coupled to the second node through the first, second and third conductive elements.

3. The method described in claim 2 further comprising exposing the first and second nodes by removing passivation over the first and second nodes before depositing the second and third conductive elements.

4. The method described in claim 3 wherein the first and second conductive elements are coupled together at a first location, wherein the first and third conductive elements are coupled together at a second location, the method further comprising cleaning the first and second locations before depositing the second and third conductive elements.

5. The method described in claim 2 further comprising cutting a pre-existing coupling between the first and second nodes in the integrated circuit.

6. The method described in claim 2 wherein the first conductive element is greater than or equal to 200 microns in length.

7. The method described in claim 1 wherein the first conductive element comprises platinum.

8. The method described in claim 1 wherein the first conductive element comprises gold.

9. The method described in claim 1 wherein the first conductive element comprises tungsten.

10. The method described in claim 2 wherein the second and third conductive elements comprise tungsten.

11. A method for editing an integrated circuit, the method comprising:

depositing a second conductive element between a first node of the integrated circuit and a first location in the integrated circuit with a focused ion beam (FIB) tool;

depositing a third conductive element between a second node of the integrated circuit and a second location in the integrated circuit with the FIB tool;

depositing a first conductive element on the integrated circuit with a laser chemical vapor deposition (LCVD) tool between the first and second locations such that the first node is coupled to the second node through the first, second and third conductive elements.

12. The method described in claim 11 further comprising exposing the first and second nodes by removing passivation over the first and second nodes before depositing the second and third conductive elements.

13. The method described in claim 11 further comprising cutting a pre-existing coupling between the first and second nodes in the integrated circuit.

14. The method described in claim 11 wherein the first conductive element is greater than 200 microns in length.

15. The method described in claim 11 wherein the first conductive element comprises platinum.

16. The method described in claim 11 wherein the second and third conductive elements comprise tungsten.

\* \* \* \* \*